United States Patent
Kuroda

(10) Patent No.: US 8,321,607 B2
(45) Date of Patent: Nov. 27, 2012

(54) SEMICONDUCTOR MEMORY DEVICE AND MULTILAYERED CHIP SEMICONDUCTOR DEVICE

(75) Inventor: Masami Kuroda, Tokyo (JP)

(73) Assignee: Sony Corporation, Tokyo (JP)

( * ) Notice: Subject to any disclaimer, the term of this patent is extended or adjusted under 35 U.S.C. 154(b) by 293 days.

(21) Appl. No.: 12/805,682

(22) Filed: Aug. 13, 2010

(65) Prior Publication Data

US 2011/0069523 A1    Mar. 24, 2011

(30) Foreign Application Priority Data

Sep. 18, 2009 (JP) .................... 2009-217410

(51) Int. Cl.
*G11C 5/06* (2006.01)
(52) U.S. Cl. .......................... 710/31; 714/718
(58) Field of Classification Search .............. None
See application file for complete search history.

(56) References Cited

U.S. PATENT DOCUMENTS

| | | | |
|---|---|---|---|
| 6,438,066 B1 * | 8/2002 | Ooishi et al. | 365/233.13 |
| 6,944,737 B2 * | 9/2005 | Ahn et al. | 711/167 |
| 7,444,575 B2 * | 10/2008 | Ong | 714/742 |

FOREIGN PATENT DOCUMENTS

| | | |
|---|---|---|
| JP | 09-063263 | 3/1997 |
| JP | 11-039871 | 2/1999 |
| JP | 2001-202780 | 7/2001 |
| JP | 2007-062296 | 3/2007 |

* cited by examiner

*Primary Examiner* — Hoai V Ho
*Assistant Examiner* — James G Norman
(74) *Attorney, Agent, or Firm* — Rader Fishman & Grauer, PLLC

(57) ABSTRACT

Disclosed here is a semiconductor memory device including: a semiconductor substrate; a plurality of pads formed on the semiconductor substrate and configured to permit data input and output; and a memory core block and an I/O block integrated on the semiconductor substrate. The data items are input and output to and from the plurality of pads at twice a maximum access rate in effect.

12 Claims, 6 Drawing Sheets

SEMICONDUCTOR MEMORY DEVICE AND MULTILAYERED CHIP SEMICONDUCTOR DEVICE

BACKGROUND OF THE INVENTION

1. Field of the Invention

The present invention relates to DDR (Double Data Rate) semiconductor devices such as a DDR SDRAM (Double-Data-Rate Synchronous Dynamic Random Access Memory). More particularly, the invention relates to a semiconductor memory device and a multilayered chip semiconductor device capable of reducing the data rate of the memory core to half or of making the input/output rate of an external I/O circuit twice as high as the internal input/output rate if the data rate is the same in the same manner as the DDR_SDRAM or the like.

2. Description of the Related Art

There exists a technique for making the data input/output rate of an external I/O circuit of the chip twice as high as the data rate at which data is written to and read from the internal memory core if the frequency is the same. The representative semiconductor memory to which this technique is applied is the DDR SDRAM of which the circuit structure and operations (data read/write in burst transfer mode and I/O circuit workings) are described in detail in Japanese Patent Laid-Open Nos. Hei 9-63263, Hei 11-39871 and 2001-202780; and Japanese Patent Application No. 2007-62296 (hereinafter referred to as Patent Document 1).

The technique for making the external data rate higher than the internal data rate applies essentially to diverse kinds of semiconductor memories in addition to DRAMs. For this reason, this technique is simply called DDR so that it will not be limited to such DRAMs as SDRAM from a data rate point of view. The semiconductor memories to which DDR is applied are called DDR memories. By contrast, the ordinary semiconductor memories to which DDR was not applied are called SDR (single data rate) memories, and the techniques excluding such application of DDR are simply called SDR.

SUMMARY OF THE INVENTION

DDR is a technique that doubles the data rate hitherto attained by the traditional SDR. Since the rate or frequency of the data output and input to and from the external I/O circuit is made twice as high as that of SDR memories, it is that much difficult for this technique to guarantee data waveform quality.

In order to circumvent the difficulty, the above-cited Patent Document 1 discloses a structure whereby DDR operations are made possible even if the operating frequency of the external I/O circuit is lowered by control of the memory controller. In this manner, the disclosed structure aims at diminishing noise and reducing power dissipation.

The DDR memory needs dual phase clock signals whose phases are inverse to each other as well as a data strobe signal in order to maintain I/O synchronization. That means the DDR memory needs more control signals than the SDR memory. In particular, the number of necessary control signals is further raised if control is divided into numerous phases where the operating frequency of the external I/O circuit or controller is lowered so as to guarantee data waveform quality through noise reduction, as discussed in the Patent Document 1. The arrangement further complicates the structure of the external I/O circuit.

Meanwhile, if the external I/O circuit sufficiently guarantees waveform quality and has room for further raising the frequency, then it is possible to double the width of the bits transferred in bursts from the memory core. This can quadruple the rate of the data output and input to and from the external I/O circuit attained by the ordinary SDR memory. For example, in the field of SDRAMs, there exist a DDR2_SDRAM that has doubled both the operating frequency of an external I/O circuit and the burst transfer bit width of the DDR. This DDR2_SDRAM provides a data rate four times as high as that of ordinary SDR_SDRAMs.

However, the bit width of the data output and input to and from the external I/O circuit is subject not only to the performance of the internal memory core and that of the external I/O circuit but also to the number of external terminals (external connection pads) being limited by layout. Thus according to the current DDR technique, the data to be output to the external I/O circuit needs to be converted into serial data from the form in which it was retrieved parallelly from a plurality of memory columns. The data to be input from the outside also needs to be converted to serial form.

The present invention has been made in view of the above circumstances and provides among others a semiconductor memory which maintains a data rate as high as that of DDR and which permits the input and output of parallel data without being constrained typically by the number of external terminals.

In carryout out the present invention and according to one embodiment thereof, there is provided a semiconductor memory device including: a semiconductor substrate; a plurality of pads formed on the semiconductor substrate and configured to permit data input and output; and a memory core block and an I/O block integrated on the semiconductor substrate; wherein, for every two data lines of the memory core block and for every two of the pads to and from which two data items are input and output, the I/O block is configured to switch reciprocally combinations of the interconnected data lines and pads based on an input address signal in such a manner as to determine to which of the two pads the two data items correspond, one of the two data lines being determined to be accessed for the memory address thereof based on information about the combinations, whereby the data items are input and output to and from the plurality of pads at twice a maximum access rate in effect.

Preferably, for every two data lines of the memory core block and for every two of the pads, the I/O block may have a selection circuit configured to assign the two output data items read from the memory core block to the two pads in accordance with one given address and to switch the pads to which the data items are output in keeping with another given address, the selection circuit being further configured to assign the two input data items coming from the two pads to the two data lines in accordance with one given address and to switch the data lines to which the data items are output in keeping with another given address.

Preferably, the semiconductor memory device of the present invention may further include a plurality of pads for test purposes disposed on an element-formed side of the semiconductor substrate. In this structure, the semiconductor memory device of the invention may preferably further include a data compression circuit configured to output test results to an integrated circuit of the semiconductor substrate, wherein the pads for test purposes are in size equal to or larger than, and fewer in numbers than, the pads for data input and output purposes.

For a data write operation, with the above-outlined structure in use, a plurality of pads formed on one principal surface of the semiconductor substrate for data input and output are fed with write data (input data). An address signal is further supplied from the outside (from the inside if a decoder is provided). What follows is an explanation of how the I/O circuit in its basic structure operates illustratively in conjunction with the selection circuit arrangement installed.

For a data read operation, the selection circuit assigns two output data items read from the memory core block to the above-mentioned two pads in response to one given address. When another address is input, the selection circuit switches the pads to which the data items are output in keeping with the input address. These are the basic I/O control operations upon read operation.

For reach different address given, the I/O circuit recognizes the pads to which the retrieved data items are output and the data lines over which the data items were retrieved. This enables the I/O circuit to distinguish the two data items output to the two data pads as the different read data corresponding to different memory addresses.

The basic structure of the I/O circuit may be furnished recurrently at intervals of two data lines and two pads. In another embodiment, the basic structure of the I/O circuit may be provided recurrently at intervals of four data lines, i.e., two input data lines and two output data lines. In a further embodiment, the basic structure of the I/O circuit may be disposed recurrently at intervals of four pads, i.e., two input pads and two output pads. However, it should be noted that either two input data lines or two output data lines, as well as either two input pads or two output pads, are used concurrently at any one time in the operation.

In the data read operation, two data items can be output between the time at which one address is given and the time at which the next address is given (i.e., during the access period). It follows that data items are output from the device at twice a maximum access rate in effect. The maximum access rate refers to the highest rate at which continuous access is performed in the shortest cycle in units of data granularity defined as the narrowest data width that can be controlled through addressing.

The workings outlined above pertain to the data read operation. In a data write operation, by contrast, the direction in which data items are output to relevant data lines under control of the basic structure such as the selection circuit is different from what is in the data read operation. The basic workings such as the selection in the data write operation are the same as those in the data read operation.

In the data write operation, too, the I/O circuit recognizes the pads from which data items were input and the data lines to which the input data items are assigned for each different address. This enables the I/O circuit to distinguish the data items fed to the two pads as having been sent to different columns (cell columns) of the memory core block for the write operation. The I/O circuit can further recognize the relation of correspondence between the data items and the columns. Also, data items are input from outside the device at twice the maximum access rate before being written to the memory core block.

It is customary to provide test pads on the element-formed side of the semiconductor substrate to deal with the need for bringing test probes into contact with the pads. Alternatively, the test pads may be furnished on the back side (as will be discussed later as a variation). When the test probes are to be provided on the element-formed side, the test pads are generally located on the periphery where the elements of the semiconductor substrate are not formed so that contact pressure will not damage the lower layers. That means the maximum number of test pads is constrained by chip size. Usually, the test pads in this setup are larger in size and fewer in numbers than the pads for data input and output. Although the test pads are sometimes made equal in size to the data input/output pads, such cases are relatively rare.

The pads for data input and output may be located anywhere on one principal surface of the chip, typically using the metal wiring on the topmost layer. This means that the data input/output pads have a high degree of freedom in their layout and are furnished in relatively large numbers. This point can be taken advantage of when this invention is applied to a setup that involves twice or four times as many pads for data input and output as the ordinary setup. The reduced number of test pads can be compensated by the suitable operations of a data compression circuit, whereby all memory cells included in the memory core block can be tested.

According to another embodiment of the present invention, there is provided a multilayered chip semiconductor device including a first semiconductor substrate containing a control block and a second semiconductor substrate containing a memory block, the first and the second semiconductor substrates being interconnected electrically to form a layered substrate structure. The second semiconductor substrate corresponds to the semiconductor substrate of the above-outlined semiconductor device according to an embodiment of the present invention. As with the inventive semiconductor device, the second semiconductor substrate of this embodiment includes a plurality of pads for data input and output, and a memory core block and an I/O block integrated with one another. The workings of the I/O block are the same as those of its counterpart in the inventive semiconductor device above.

As outlined above, the present invention provides a semiconductor memory and a multilayered chip semiconductor device capable of maintaining as high a data rate as with DDR and of inputting and outputting parallel data without being constrained typically by the number of external terminals.

BRIEF DESCRIPTION OF THE DRAWINGS

Further advantages of the present invention will become apparent upon a reading of the following description and appended drawings in which.

DETAILED DESCRIPTION OF THE PREFERRED EMBODIMENTS

The preferred embodiments of the present invention implemented illustratively as a multilayered chip semiconductor device each will now be described with reference to the accompanying drawings under the following headings:

1. First embodiment (with two internal ports and two external ports);
2. Second embodiment (with four internal ports and two external ports);
3. Third embodiment (with two internal ports and four external ports);
4. Fourth embodiment (with four internal ports and four external ports);
5. Fifth embodiment (a more detailed example with two internal ports and four external ports); and
6. Variations.

<1. First Embodiment>
[Multilayered Chip Structure]

Figure 1:
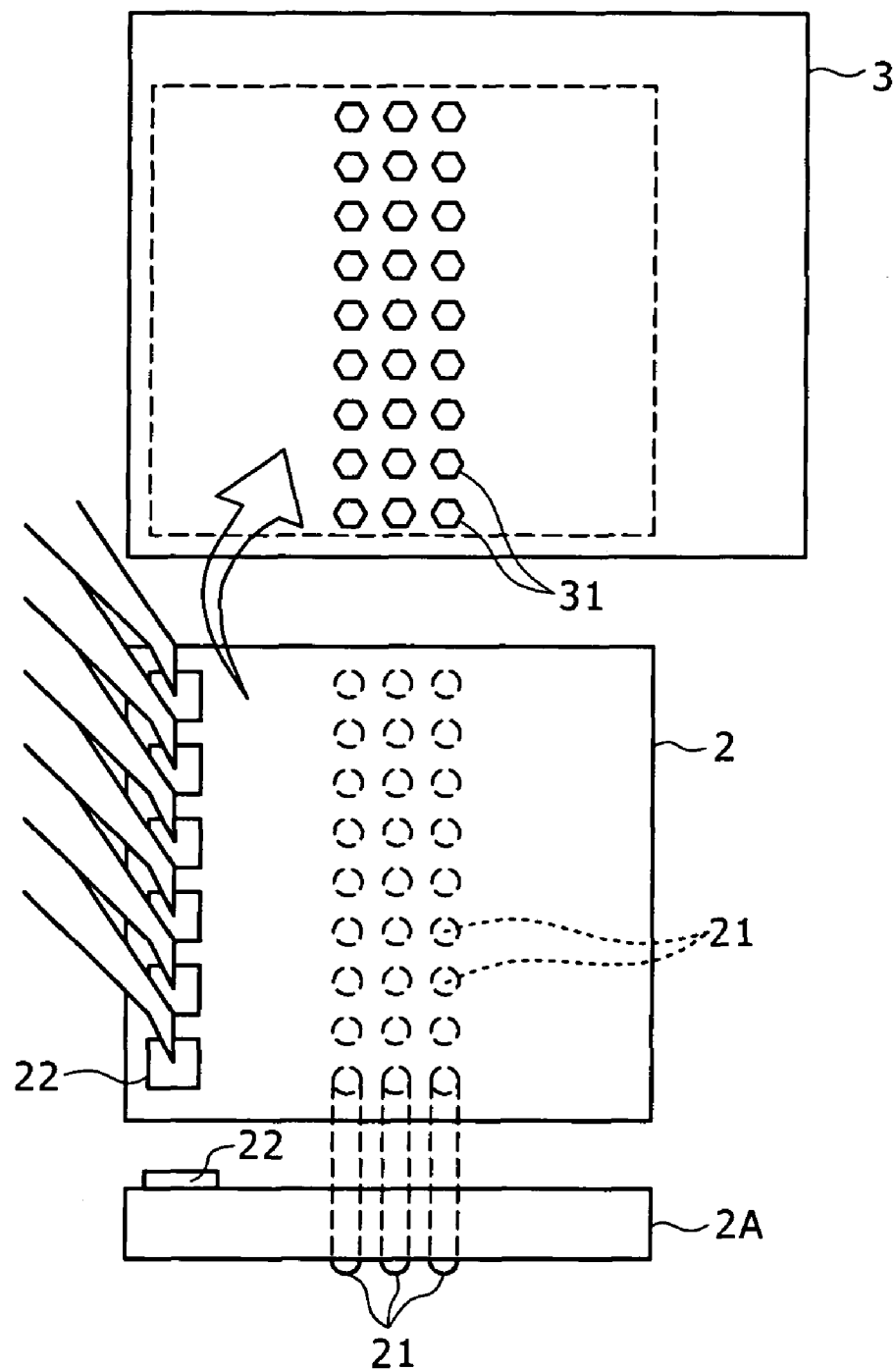
FIG. 1 is a schematic view explanatory of how chips are layered and how pads are disposed on each of the chips in a multilayered chip semiconductor device implemented as a first through a fifth embodiment of the present invention.

FIG. 1 is a schematic view explanatory of how chips are layered and how pads are disposed on each of the chips in a multilayered chip semiconductor device 1 as the first embodiment. The multilayered chip semiconductor device 1 in FIG. 1 is made up of a semiconductor memory device chip (simply called the semiconductor memory device 2 hereunder) and another chip 3 on which the semiconductor memory device 2 is layered. Illustratively where a system LSI is to be constituted, the semiconductor device 1 is formed by layering the semiconductor memory device 2 on the chip 3, the semiconductor memory device 2 including a second semiconductor substrate 2A integrating memory elements, the chip 3 having a first semiconductor substrate integrating a control block such as a system controller and a logic block.

In this structure, a plurality of pads for data input and output (called the layer connection pads 21 hereunder) are provided in large numbers on one principal surface of the semiconductor memory device 2. On the periphery of the front side (element-formed side) of the semiconductor memory device 2, a predetermined number of test pads 22 are furnished for testing purposes.

That side of the semiconductor memory device 2 that is connected to the chip 3 may be referred to hereunder as the back side in that the side is opposite to the element-formed side. In one variation of the embodiment, to be discussed later, the layer connection pads 21 may be formed on the same side as the element-formed side.

In the example of FIG. 1, the layer connection pads 21 are smaller in size than the test pads 22 so that they can be densely populated. The layer connection pads 21 are connected electrically and mechanically to pads 31 formed on the front side (element-formed side) of the chip 3.

These pads (layer connection pads 22 and pads 31) for bare chip mounting may be formed illustratively as bumps on one side (made of solder) and as lands on the other side (the same as wiring layer). In the example of FIG. 1, the layer connection pads 21 formed on the back side of the semiconductor memory device 2 are bumps and the pads 31 formed on the front side of the chip 3 are lands.

Although the solder bumps are usually circular in shape as indicated in the side view of FIG. 1, they may alternatively be ball bumps. As another alternative, the bumps may be replaced by diverse types of connection terminals such as those of a conductive bonding layer (i.e., conductive grains whose conductive state is maintained by pressure bonding). As a further alternative, the connection terminals may be pressure-bonded to the lands (indicated by broken lines) to ensure electrical connection.

In the example of FIG. 1, each of the test pads 22 which are relatively large in size is provided for every predetermined plurality of layer connection pads 21. In this setup, the test pads 22 are positioned with a relatively large pitch because they come into contact with probes or test pins during testing. Also, the pad size needs to be made larger correspondingly. That means as many test pads 22 cannot be provided as the layer connection pads 21. Thus the test pads 22 are positioned on the periphery of the front side of the semiconductor memory device 2.

The reason the test pads 22 are located on the periphery of the chip is that the periphery has no circuit elements formed therein. If the elements such as transistors were formed in a layer under the test pads 22, these elements could be damaged when probes or test pins are pressed against the test pads 22. It is for the purpose of averting such damage that the positions of the test pads 22 are generally limited to the periphery of the semiconductor memory device 2.

Where the present invention is implemented, twice to four times as many layer connection pads 21 are needed as the external terminals usually required by the DDR scheme in order to maintain an external data rate equivalent to that scheme. If so many layer connection pads 21 were positioned on the chip periphery, the chip size of the semiconductor memory device 2 would be made correspondingly larger, which is not a desirable development. To avoid this bottleneck, the setup in FIG. 1 has a plurality of layer connection pads 21 for data input and output positioned on the back side of the regions inside the chip periphery where the elements are to be formed on the semiconductor memory device 2.

Unlike the test pads 22, the layer connection pads 21 may be formed anywhere on the principal surface of the chip. Also, the layer connection pads 21 do not come into contact with probes or test pins, so that they will not introduce damage to the elements. For these reasons, the layer connection pads 21 can be formed in regions other than the chip periphery, and more of the layer connection pads 21 can thus be installed than if they were positioned on the periphery.

It is not mandatory to position the layer connection pads 21 on the back side of the chip as shown in FIG. 1. Illustratively, where another chip 3 is mounted onto the chip of a memory-mounted semiconductor memory device 2 (for bare chip mounting), the layer connection pads 21 made of lands or bumps are positioned on the same element-formed side as the test pads 22. In this arrangement, the pads 31 of the chip 3 are located on the back side. However, this setup is also common to that of FIG. 1 in that the test pads 22 are positioned on the chip periphery and that the layer connection pads 21 are located inside of the periphery.

The memory block of the semiconductor device 1 structured as described above may be a DRAM, an SRAM, a nonvolatile memory, or any other type of memory. The nonvolatile memory may be of diverse kinds, such as one with chargeable memory transistors as its memory elements, one with resistance change elements as its memory elements, or one with magnetic elements as its memory elements. In any of these cases, the present invention when suitably implemented provides an external data rate equivalent to that of the DDR scheme at a lower operating frequency than before, as will be discussed later.

[DDR Scheme]

First, the DDR scheme to be compared with the present invention will be briefly explained below using the SDRAM as an example. The SDRAM is a DRAM of which the memory core block transfers data to and from an external I/O circuit in synchronism with the operating frequency of a memory bus (i.e., I/O bus for the external I/O circuit). The operations of the memories prior to the SDRAM were independent of, and asynchronous with, the operating frequency of the memory bus. Because of the disconnection in operation between the memory core block and the memory bus, there had to be delays (i.e., latency) to provide for synchronization therebetween.

The bottleneck above is circumvented by the SDRAM. The memory core block of the SDRAM writes and reads data in synchronism with the operating frequency of the memory bus. More specifically, when a clock signal for synchronizing the operation changes from "0" to "1" (at a rising edge), the memory core block reads or writes data. The SDRAM has the advantage of simplifying the structure of the memory controller while reducing delays between the processor and the memory core block.

Also, the SDRAM can adopt the technique called "2″ prefetch" that doubles or quadruples in parallel the read/write speed of the memory core block per unit time; the read/write speed of the memory core is relatively difficult to increase, illustratively compared with that of the I/O block.

It is also possible to adopt the technique called "double transition clocking" that allows transfer of twice as much data as before per unit time by suitably adjusting the timing for data transfer to and from an external bus. Under the DDR scheme adopting this technique, designating one address determines according to a predetermined rule two addresses: an address for data appearing at a rising edge of a clock signal, and an address for data appearing at a falling edge of the clock signal. Thus one clock pulse allows two data bits to be transferred.

The technique "2″ prefetch" mentioned earlier causes two or four data items retrieved simultaneously to be transferred serially to an external data bus. In this case, it is necessary to make the operating frequency of the I/O block (i.e., external data rate) twice or four times as high as the internal data rate of the memory core block. This can make it difficult to guarantee data waveform quality.

Meanwhile, the technique "double transition clocking" also mentioned above requires dual phase clock signals whose phases are inverse to each other as well as a data strobe signal. These signals add to the existing control signals. This can complicate the structure of the external I/O circuit.

This embodiment is structured to reduce any increase in the number of control signals and minimize the disadvantages stemming from raising the operating frequency of the I/O block, thereby permitting the input and output of parallel data without being constrained typically by the number of external terminals. Below is a detailed description of the workings and the structure of this embodiment. In the ensuing description, the embodiment presupposes the adoption of the "2″ prefetch" technique but may or may not be used in conjunction with the "double transition clock" technique.

[Implementation of the Present Invention: Outline]

Figure 2:
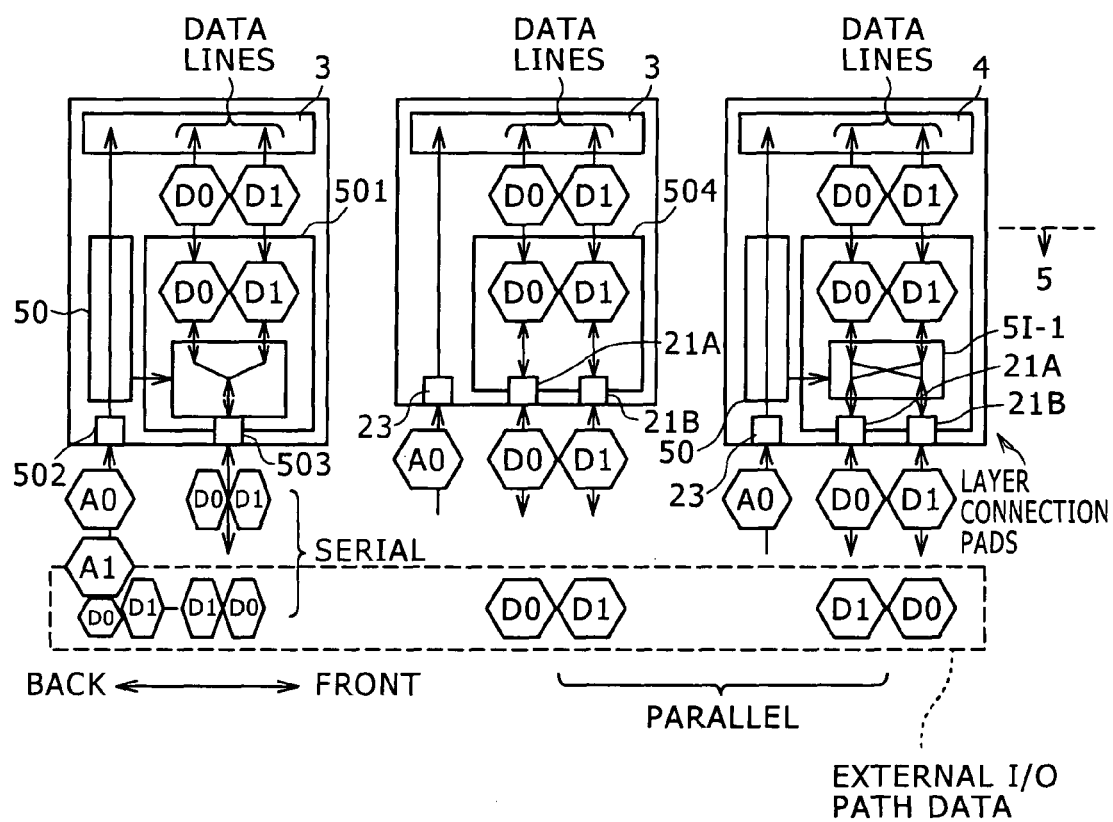
FIGS. 2A, 2B and 2C are schematic views juxtaposing an I/O block structure of the first embodiment with a DDR setup (comparative example 1) and a comparative example 2 that simply has more pads.
Figure 3:
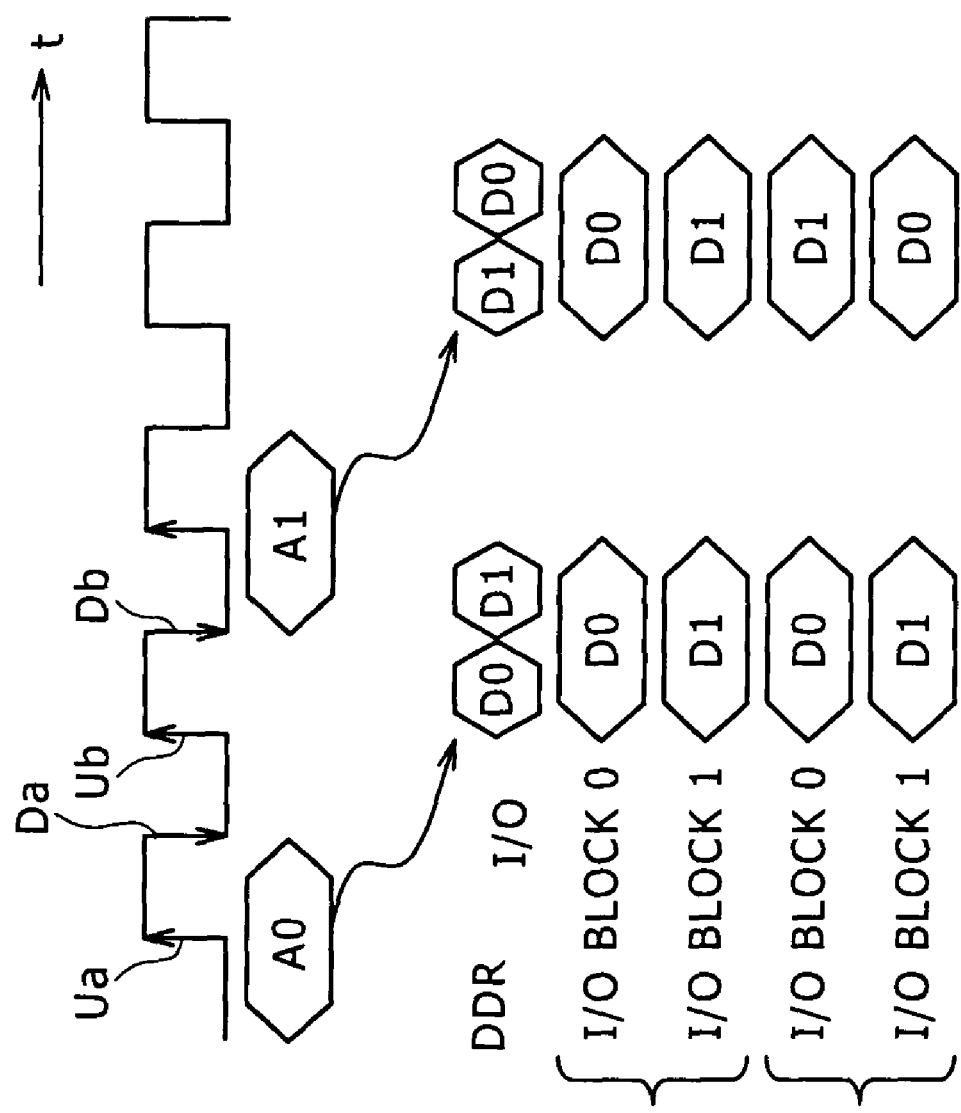
FIGS. 3A, 3B, 3C, 3D and 3E are schematic timing charts showing differences in operation among the three setups indicated in FIGS. 2A through 2C.

How the present invention is implemented is outlined below by referring to FIGS. 2A through 3E. FIGS. 2A, 2C and 2C are schematic views outlining the structure of the I/O block; and FIGS. 3A to 3E are schematic timing charts illustrating how the I/O block operates in terms of timing.

As shown in FIGS. 2A through 2C, the semiconductor memory device has a memory core block 4, and an I/O block 5 interposed between the memory core block 4 and external terminals (corresponding to layer connection pads 21 in FIG. 1) and controlling data input and output. The external terminals of the I/O block 5 are connected with an external data bus, not shown. In the example of FIG. 1, the bus in the chip 3 corresponds to an "external data bus" from the viewpoint of the semiconductor memory device 2.

FIG. 3A shows a waveform of a clock signal CLK synchronous with the I/O block 5 that controls data output and input to and from the external data bus and the memory core block.

The clock CLK may be fed illustratively from the chip 3 to the semiconductor memory device 2 via a dedicated clock pad among the layer connection pads 21. Alternatively, the clock CLK may be fed from the outside to the semiconductor memory device 2 via a dedicated clock pad that can be wire-bonded to the device 2 in the same manner as the test pads 22.

FIG. 3B shows an input example of an address ADD in synchronism with the clock CLK. In the example of FIG. 1, the address ADD is fed usually from the chip 3 to the semiconductor memory device 2 via a dedicated address pad among the layer connection pads 21.

An access example (comparative example 1) according to the DDR scheme with a burst length of 2 is illustrated both by the relevant I/O block structure in FIG. 2A and by the corresponding data input/output timing in FIG. 3C. Another example (comparative example 2) that simply doubles the number of external terminals (layer connection pads 21) so as to output data in parallel at a data rate equivalent to that of the DDR scheme is illustrated by both the relevant I/O block structure in FIG. 2B and by the corresponding data input/output timing in FIG. 3D.

As opposed to these comparative examples, the first embodiment of the present invention is illustrated by both the relevant I/O block structure in FIG. 2C and by the corresponding data input/output timing in FIG. 3E.

What follows is an explanation of the characteristics of the structure and operations of the I/O block pertaining to this embodiment shown in FIG. 2C through comparisons with the structures and the workings of the two comparative examples shown in FIGS. 2A and 2B. FIGS. 2A through 2C each show a basic structure of the I/O block. In the actual device, each of the illustrated basic structures is furnished recurrently for every two data lines.

The comparative example 1 of the DDR scheme shown in FIG. 2A involves effecting data input and output to and from two different data lines because the burst length is 2. Each of the two data lines is connected with a predetermined number of memory cells. Upon input of a row address (not shown), the memory cells in the predetermined number are accessed. The selection of the column, i.e., the determination of which of the two data lines is accessed for data input or output, is made in accordance with an (column) address A0 or A1 input to an address terminal 502.

In the comparative example 1 of FIG. 2A, the I/O block has a parallel-serial conversion block 501 to which the address A0 or A1 is given. If the given (column) address is A0, the parallel-serial conversion block 501 connects one data line over which data D0 is input or output with an external terminal 503 used commonly for input and output. If the given (column) address is A1, then the parallel-serial conversion block 501 connects the other data line over which the data D1 is input or output with the external terminal 503 used for both input and output.

Given an address A1, the operation above is carried out after the data line to be connected has been switched. For this reason, the external I/O bus data constitutes serial data since the data D0 is first output in response to the address A0 given earlier followed by the data D1. When the address A1 is later given, the data D1 is first output onto the external I/O bus followed by the data D0 in series.

The operation above is shown in the timing chart of FIG. 3C. The timing chart indicates the order in which data items are input and input along the horizontal axis representing time "t." Thus the earlier the data shown toward the left in the chart, the earlier the data output onto the bus. It should be noted that with regard to the data in FIG. 3C and the external I/O bus data in FIGS. 2A through 2C, the data D0 and data D1 are reversed in sequence.

In the comparative example 2 of FIG. 2B, the basic structure 504 of the I/O block does not have the function of parallel-serial conversion. The comparative example 2 has about twice as many external terminals as the comparative example 1 by use of the layer connection pads 21 positioned in the same manner as in FIG. 1. In FIG. 2B, the layer connection pad 21 for input/output 0 corresponding to the data D0 is indicated by reference character 21A. Likewise, the layer connection pad 21 for input/output 1 corresponding to the data D1 is indicated by reference character 21B.

When an address (e.g., address A0 in FIG. 2B) is given, the comparative example 2 structured as described above enables two data lines to input or output the corresponding data D0 and D1. This operation is carried out likewise when another address A1 is given.

In the comparative example 2, however, the input/output 0 of the layer connection pad 21A and the input/output 1 of the layer connection pad 21B constitute parallel data of the same juxtaposition as in FIG. 3D. That means the data cannot be distinguished by the address. That is, twice as many external terminals furnished simply in the form of the layer connection pads 21 shown in FIG. 1 render the apparent data rate twice as high but in fact fail to double the actually usable data rate (i.e., effective data rate).

As opposed to the comparative example 2, the basic structure of this embodiment shown in FIG. 2C has the I/O block 5 incorporating a selection circuit 51_1 capable of reciprocally switching combinations of the interconnected data lines and pads in accordance with the input address signal. The I/O block 5 also includes an I/O controller 50. Although the I/O controller 50 itself is already included in the DDR setup of FIG. 2A (i.e., comparative example 1), the I/O controller 50 of this embodiment controls the selection circuit 51_1.

The selection circuit 51_1 may assign the two output data items read from two data lines of the memory core block 4 to the layer connection pads 21A and 21B in response to the address A0, and may switch the pads to which the data items are output in accordance with the other address A1. Also, the selection circuit 51_1 may assign the two input data items from the two pads (21A and 21B) to the two data lines above in response to the address A0, and may switch the data lines to which the data items are output according to the other address A1.

The function above may be implemented alternatively by an arrangement other than the selector (i.e., selection circuit 51_1) capable of reciprocally switching the two input and two output data items above. For example, suppose that the memory of the memory core block 4 can output complementary data as in the case of an SRAM and that the two data lines shown in FIG. 2C are complementary data lines. Given that assumption, upon input of the address A0, an inverter may be used to generate two data items D0 and D1 from the data of one data line; upon input of the other address A1, another inverter may be utilized to generate the two data items D1 and D0 of reverse logic using two pads.

In each of the cases above, the I/O controller 50 itself acquires information about which data lines the data items D0 and D1 input or output via two pads (21A and 21B) correspond to, based on the control signals generated in response to the addresses. The I/O controller 50 can distinguish the data by exchanging relevant information with an external section utilizing external I/O bus data, such as a control block inside the chip 3 of FIG. 1.

As described, the I/O block 5 of the present invention has at least the following two basic functions:

(1) The function of reciprocally switching combinations of the interconnected data lines and pads for every two data lines and two pads (21A and 21B) of the memory core block 4 on the basis of the input address signal (A0 or A1); and (2) The function of determining to which of the two data lines the data items involved correspond, one of the two data lines being determined to be accessed for the memory address thereof based on information about the combinations provided by the function (1) above.

The function (1) above may also be said to be a function that reciprocally switches the two pads (21A and 21B) as the destination for the input/output of the first data D0 corresponding to the address A0 or as the destination for the input/output of the second data D1 corresponding to the other address A1. This function applies to the burst operation in which two cell data items are input or output simultaneously.

The above two functions allow the semiconductor memory device of the first embodiment to output or input data to or from a plurality of layer connection pads 21 at twice a maximum access rate in effect. The maximum access rate refers to the highest rate at which continuous access is performed in the shortest cycle in units of data granularity defined as the narrowest data width that can be controlled through addressing.

The address A0 may be taken up here for purpose of illustration in reference to FIGS. 3A through 3E. The address A0 is fetched at a rising edge Ua of a pulse. At the next rising edge Ub, the data D0 is input or output. Then at the falling edge of the same pulse, the data D1 is input or output. Thus the minimum inter-address distance (corresponding to the maximum access rate) is two cycles of the clock CLK.

However, the above arrangement is not limitative of the present invention. Alternatively, when data is input or output only at rising edges of the pulse, i.e., when the aforementioned technique "double transition clocking" is not being adopted, the present invention can still be applied. In any case, the present invention when suitably implemented can make the rate for data input and output twice as high as that of the DDR scheme without raising the frequency of the I/O block 5.

<2. Second Embodiment>

Figure 4:
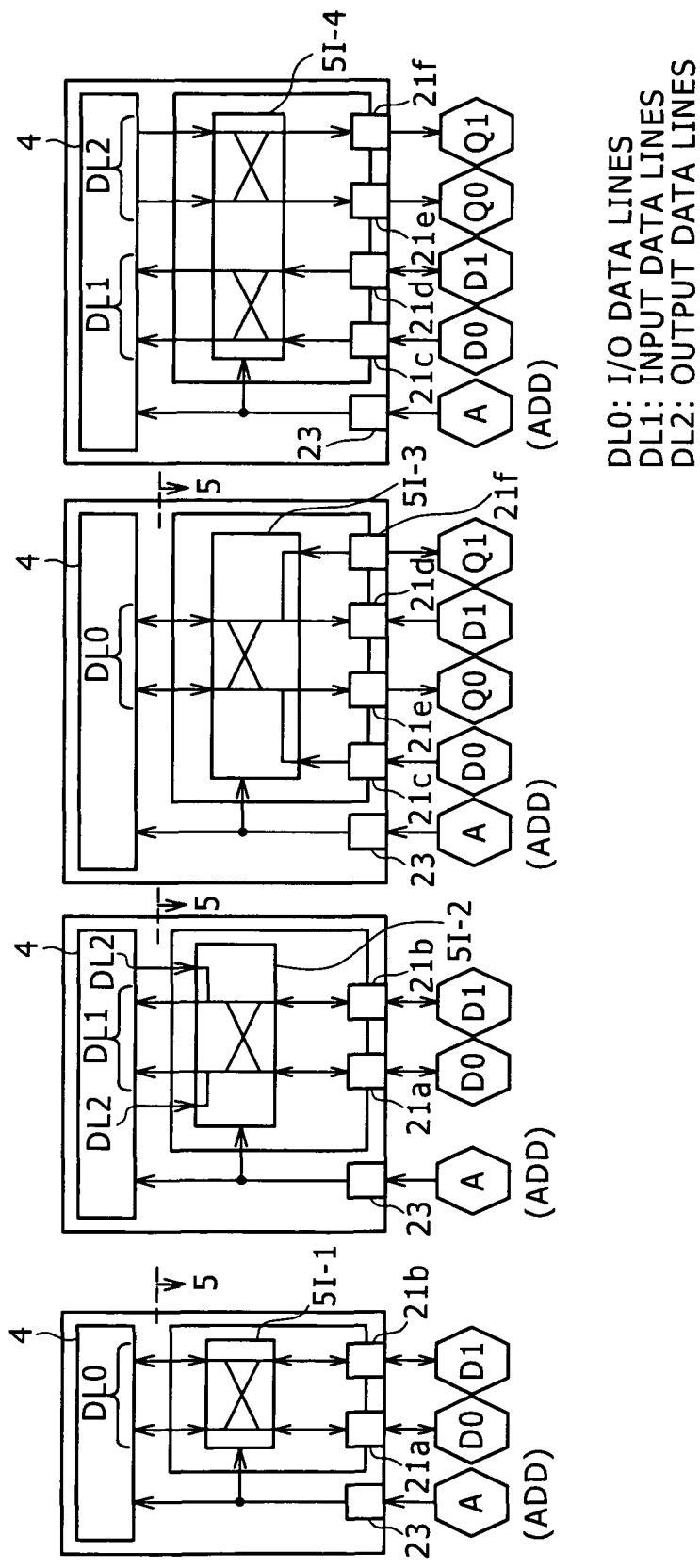
FIGS. 4A, 4B, 4C and 4D are schematic views showing I/O block structures of the second through the fourth embodiments in comparison with that of the first embodiment.

FIGS. 4B through 4D schematically show the structures of the second through the fourth embodiments in comparison with the first embodiment of FIG. 4A. In these structures, the I/O controller 50 found in FIG. 2C is not shown. FIG. 4B outlines a typical structure of the I/O block 5 pertaining to the second embodiment.

In the I/O block 5 of FIG. 4B, a selection circuit 51_2 includes two external ports (layer connection pads 21A and 21B) each used commonly for data input and output. This arrangement is the same as that of the selection circuit 51_1 in the first embodiment of FIG. 4A.

The selection circuit 51_2 in FIG. 4B differs from the selection circuit 51_1 in FIG. 4A in that the selection circuit 51_2 has four internal ports corresponding to input data lines DL1 and output data lines DL2 held by the memory core block 4. More specifically, the selection circuit 51_2 has two internal input ports connected individually to each of the input data lines DL1, and two internal output ports connected individually to each of the output data lines DL2.

By contrast, the selection circuit 51_1 of the first embodiment shown in FIG. 4A has two internal ports (internal input/output ports) connected individually to each of input/output data lines DL0 used commonly for data input and output.

As with the first embodiment, the second embodiment can input or output data through a plurality of layer connection pads 21 at twice the maximum access rate in effect. Alternatively, the second embodiment can make the rate of data input or output twice as high as the equivalent rate of the DDR scheme without raising the frequency of the I/O block 5.

The second embodiment is particularly advantageous for setups such as a two-port SRAM with inputs and outputs attached separately to the memory cells. Since the pair of input data lines DL1 is not used concurrently with the pair of output data lines DL2, the structure of FIG. 4B may also be applied to DRAMs or the like of which the data lines are not separated for input and output purposes.

<3. Third Embodiment>

FIG. 4C schematically shows a typical structure of the I/O block 5 pertaining to the third embodiment. The I/O block 5 shown in FIG. 4C has a selection circuit 51_3 that is common to its counterpart of the first embodiment in FIG. 4A in that the selection circuit 51_3 has two internal ports. These two internal ports are connected individually to each of the two input/output data lines DL0.

The selection circuit 51_3 in FIG. 4C differs from the selection circuit 51_1 in FIG. 4A in that the external ports are furnished separately for data input and output purposes in the selection circuit 51_3. More specifically, the semiconductor memory device has two pads for input purposes (data input pads 21c and 21d) and two pads for output purposes (data output pads 21e and 21f). Correspondingly, the selection circuit 51_3 has two external input ports connected individually to each of the data input pads 21c and 21d. The selection circuit 51_3 also has two external output ports connected individually to each of the data output pads 21e and 21f.

The selection circuit 51_3 is a circuit that switches reciprocally a pair of pads furnished separately for data input and output purpose, as the destination for the input/output of a first data item in accordance with one address A0 or as the destination for the input/output of a second data item corresponding to another address A1. The first data item becomes "D0" upon input and "Q0" upon output. The second data item becomes "D1" upon input and "Q1" upon output.

The above-described function of the selection circuit 51_3 applies to the burst operation in which two cell data items are simultaneously input or output. More specifically, when the data input pad 21c is selected, the data output pad 21e is selected; when the data input pad 21d is selected, the data output pad 21f is selected.

As with the first embodiment, the third embodiment can input or output data through a plurality of layer connection pads 21 at twice the maximum access rate in effect. Alternatively, the third embodiment can make the rate of data input or output twice as high as the equivalent rate of the DDR scheme without raising the frequency of the I/O block 5.

<4. Fourth Embodiment>

FIG. 4D schematically shows a typical structure of the I/O block 5 pertaining to the fourth embodiment. The I/O block 5 in FIG. 4D has a selection circuit 51_4 with its ports furnished separately for data input and output purposes on both the internal and the external side. This arrangement integrates the port arrangement of the second embodiment with that of the third embodiment.

As with the first embodiment, the fourth embodiment can input or output data through a plurality of layer connection pads 21 at twice the maximum access rate in effect. Alternatively, the fourth embodiment can make the rate of data input or output twice as high as the equivalent rate of the DDR scheme without raising the frequency of the I/O block 5.

<5. Fifth Embodiment>

Figure 5:
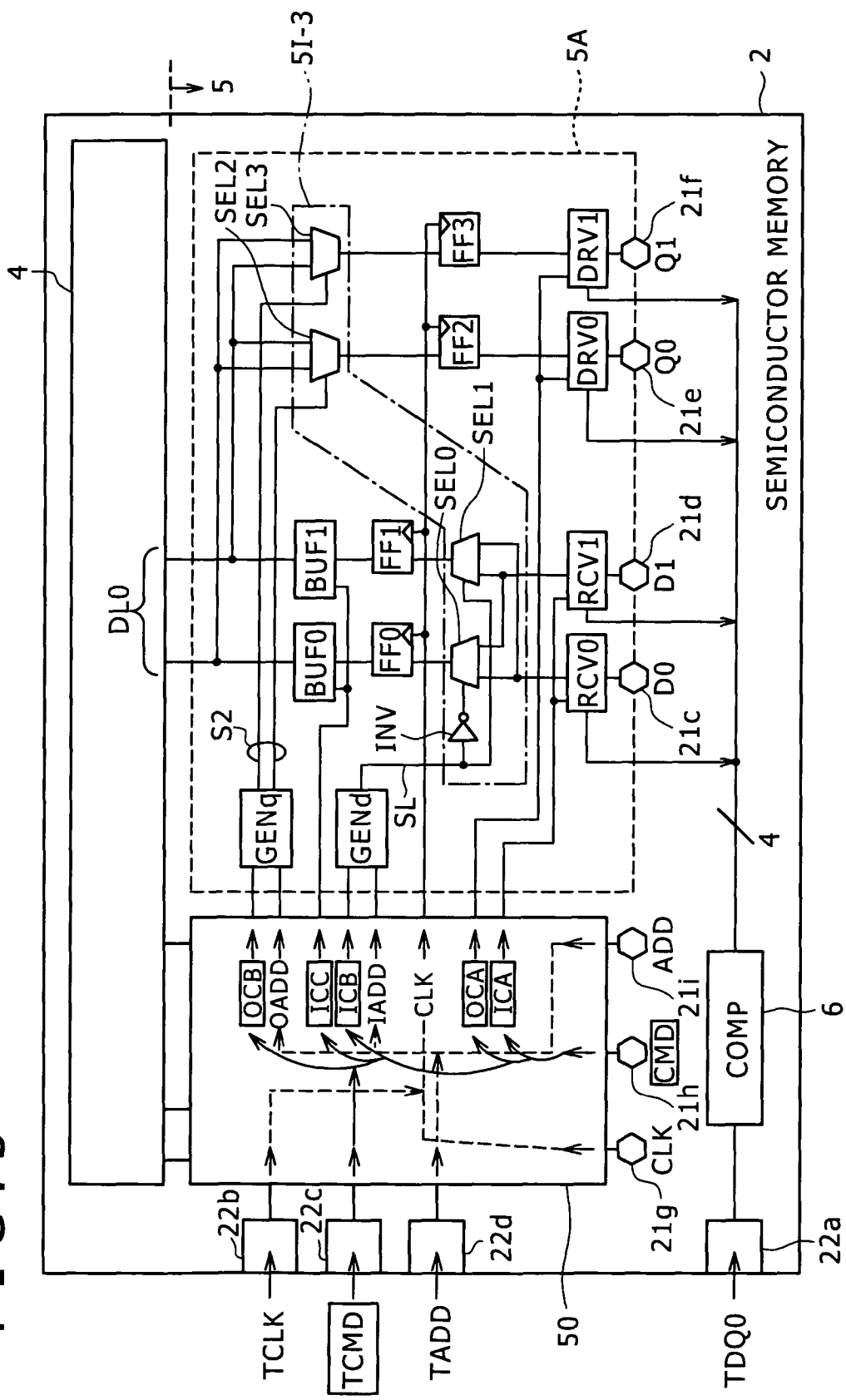
FIG. 5 is a detailed circuit block diagram of the fifth embodiment.

The fifth embodiment is an embodiment that shows the third embodiment (in FIG. 4C) in more detail. FIG. 5 is a circuit diagram showing a detailed structure of the I/O block in the semiconductor memory device 2 pertaining to the fifth embodiment.

The semiconductor memory device 2 illustrated in FIG. 5 has an I/O block 5 made up of an I/O controller 50 and the components controlled thereby (i.e., a portion enclosed by broken lines, called the I/O switching block 5A hereunder). The I/O switching block 5A has four selectors SEL0 through SEL3 making up a selection circuit 51_3. Two receiver circuits RCV0 and RCV1 are interposed between the selectors SEL0 and SEL1 on the one hand and internal input pads 21c and 21d on the other hand. Two flip-flop circuits FF2 and FF3 and two output driver circuits DRV0 and DRV1 are interposed between the selectors SEL2 and SEL3 on the one hand and internal output pads 21e and 21f on the other hand.

Also in the I/O switching block 5A, two flip-flop circuits FF0 and FF1 and two buffer circuits BUF0 and BUF1 are interposed between the selectors SEL0 and SEL1 on the one hand and the input/output data lines DL0 in the memory core block 4 on the other hand. The I/O switching block 5A further includes two generators GENd and GENq. The generator GENd generates a first select signal S1 for controlling the selectors SEL0 and SEL1, and the generator GENq generates a second select signal S2 for controlling the selectors SEL2 and SEL3.

The selector SEL0 has its first and second inputs connected to the outputs of the receiver circuits RCV0 and RCV1, respectively. The input of the receiver circuit RCV0 is connected to the internal input pad 21c, and the input of the receiver circuit RCV1 is connected to the internal input pad 21d.

The first select signal S1 may be input to the control input of the selector SEL0 via an inverter INV; the first select signal S1 may also be input to the control input of the selector SEL1. The second select signal S2 may be input individually to the control inputs of the selectors SEL2 and SEL3.

The clock inputs of the four flip-flop circuits FF0 through FF3 are fed with the clock CLK from a layer connection pad 21g by way of the I/O controller 50. The I/O controller 50 is a kind of layer connection pad 21 (in FIG. 1). As such, the I/O controller 50 can admit the clock CLK, command CMD, and address ADD from internal pads 21g, 21h and 21j used for normal operations. The I/O controller 50 is also a kind of test pad 22 for test use. As such, the I/O controller 50 can admit a test clock TCLK, a test command TCMD, and a test address TADD from external pads 22a, 22b, 22c and 22d.

The I/O controller 50 has the capability to separate (or decode) the input address ADD into an input address IADD and an output address OADD as signals to be fed to the I/O switching block 5A. The input address IADD is sent to the generator GENd and the output address OADD is forwarded to the generator GENq.

The I/O controller 50 sends an input control A signal (ICA) to the receiver circuits RCV0 and RCV1 and an output control A signal (OCA) to the output driver circuits DRV0 and DRV1. Also, the I/O controller 50 feeds an input control B signal (ICB) to the generator GENd and an input control C signal (ICC) to the buffer circuits BUF0 and BUF1. Furthermore, the I/O controller 50 supplies an output control B signal to the generator GENq. These control signals are generated and output in response to the command CMD.

The above-described structure operates as follows: at wafer test time, the test clock TCLK, test command TCMD, and test address TADD are input to the I/O controller 50 from the test pads 22a through 22d. Test data TDQ0 is exchanged between the test pad 22a used commonly for input and output on the one hand and an external tester on the other hand to carry out tests. The test data to be to be input at this point includes expected value data. The test data to be output includes test read data compressed by a data compression circuit (COMP) 6 provided in the semiconductor memory device 2 as shown in FIG. 5.

Figure 6:
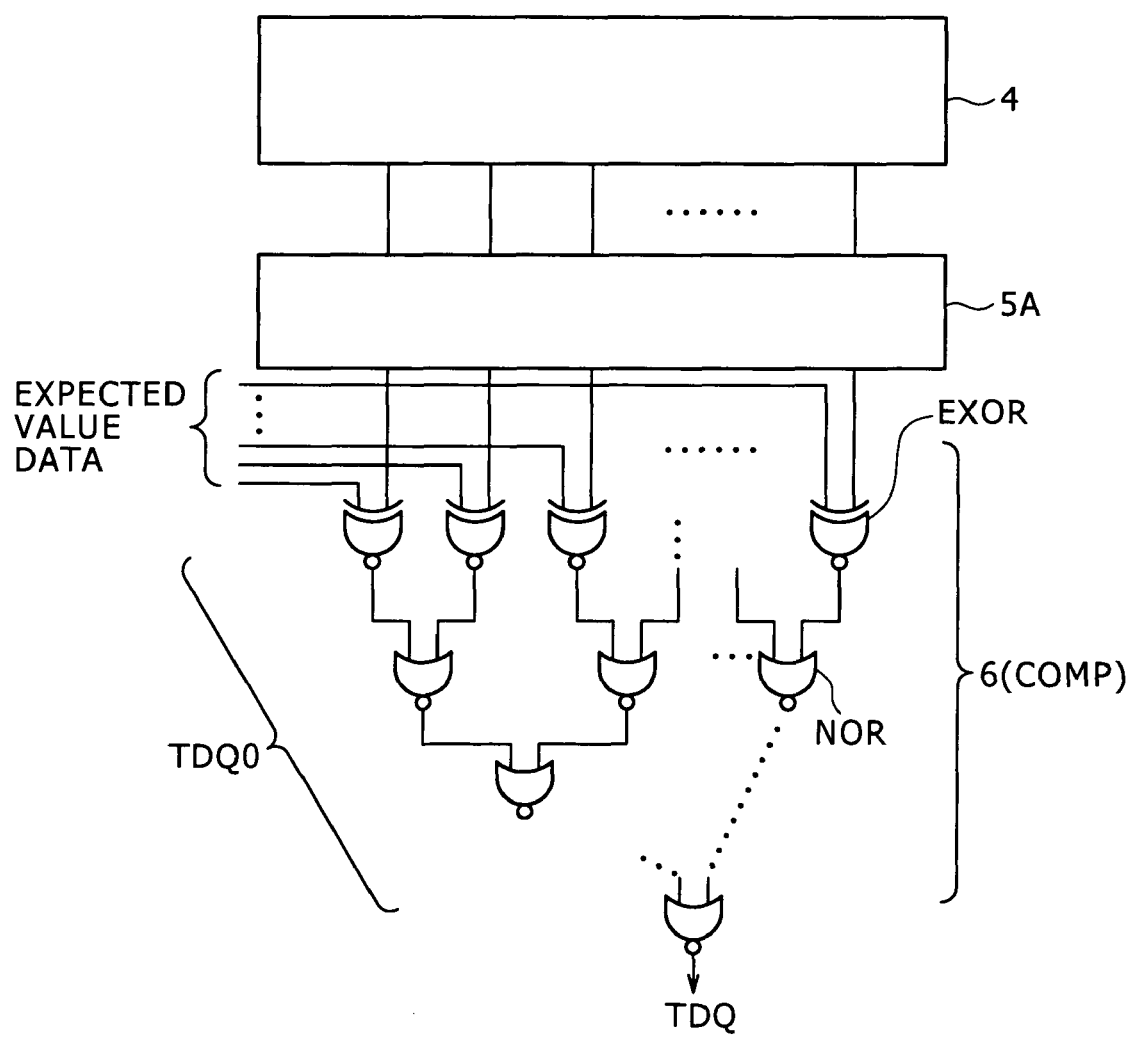
FIG. 6 is a circuit block diagram showing a typical data compression circuit.

FIG. 6 is a circuit block diagram showing a typical circuit structure of the data compression circuit 6. The data compression circuit 6 shown in FIG. 6 is provided with as many first-stage exclusive-OR gates (EXOR) as the number of outputs (or may be part of all outputs) from the I/O switching block 5A. From the second stage through the last stage, the number of outputs is progressively reduced using NOR circuits. Ultimately, the data is compressed into one test data item TDQ.

Expected values are given to the first-stage exclusive-OR gates (EXOR). Thus if the expected values differ from the logic by even 1 bit, a logical "0" is output indicating that the test data TDQ has failed the test; if all bits coincide with one another, then a logical "1" is output indicating that the test is successfully passed.

The data compression circuit 6 and test pads 22 above are not mandatory for implementing the present invention. Still, in view of the fact that the layer connection pads 21 furnished in large numbers may not be matched by the same number of test pads 22, it is preferable to output test results in compressed data form. There is no need to provide as many input/output test data TDQ0 as the total number of layer connection pads 21; there may be data not used as the test data TDQ0.

Returning to FIG. 5 for the explanation of functions, tests are usually carried out in the wafer state. After the chips are layered, the I/O controller 50 performs functions other than the testing function. The other functions include inputting the clock CLK, command CMD, and address ADD from layer connection pads 21g through 21i. Because the test paths are placed in the high-impedance state (HiZ) subsequent to chip mounting, the semiconductor memory device 2 exchanges data with the chip 3 (FIG. 1) using the layer connection pads 21c through 21f.

The receiver circuits RCV0 and RCV1 have the function of switching two states: the high-impedance state (HiZ), and an input acceptance state in which a first input data item D0 and a second input data item D1 are accepted by use of the input control A signal (ICA). At test time, the receiver circuits RCV0 and RCV1 provide the function of replacing the first data item D0 with data input from the input/output test data TDQ0.

The output driver circuits DRV0 and DRV1 have the function of switching two states: the high-impedance state (HiZ), and an output state in which a first output data item Q0 and a second output data item Q1 are output using the output control A signal (OCA). At test time, the output driver circuits DRV0 and DRV1 provide the function of outputting the input/output test data TDQ0.

The selectors SEL0 and SEL1 have the function of selectively connecting the first input data item D0 and the second input data item D1 to one of the two internal input ports in accordance with the first select signal S1 generated by the generator GENd.

The selectors SEL2 and SEL3 provide two functions: the function of selecting to which of the two input/output data lines DL0 the two internal ports are to be connected in keeping with the second select signal S2 generated by the generator GENq, and the function of stopping the data input through the two internal input ports.

The buffer circuits BUF0 and BUF1 are provided to buffer the first input data item D0 and second input data item D1 before they are input into the chip. The buffer circuits BUF0 and BUF1 offer two functions: the function of outputting to the two internal input ports the data selected by the selectors SEL0 and SEL1 based on the input control C signal (ICC) fed from the I/O controller 50, and the function of stopping the data output through the two internal input ports.

In the setup of FIG. 5, the first and the second input data items D0 and D1 as well as the first and the second output data items Q0 and Q1 are each 32 bits long. In this setup, the I/O switching block 5A repeats 16 times the basic structure shown in FIG. 5, thereby constituting a 32-bit input/output arrangement equivalent to that of the DDR scheme.

<6. Variations>

In FIG. 1, the first semiconductor substrate (chip 3) is shown to be larger in area than the semiconductor memory device 2. However, this is not limitative of the present invention. Conversely, the semiconductor memory device 2 may be larger in area than the first semiconductor substrate. It is not mandatory to lead external terminals from the pads, not shown, of the first semiconductor substrate (chip 3) illustratively through wire bonding. For example, a large number of pads for external connection may be furnished along with the test pads 22 not on the side of the first semiconductor substrate (chip 3) but on the periphery of the semiconductor memory device 2. The connection between the substrate and the chip may be accomplished by the ball grid array (BGA) or by through-silicon via at the back of the chip 3.

The chip 3 may be mounted as a bare chip on the semiconductor memory device 2. In this case, the layer connection pads 21 held by the semiconductor memory device 2 may be lands connected to the pads 31 made by BGA and furnished on the back side of the chip 3 (i.e., on the side of the semiconductor memory device 2).

Regardless of mounting the semiconductor memory device 2 on the chip 3 or vice versa (i.e., the state in FIG. 1), the test pads 22 may be formed on the chip surface opposite the layer connection pads 21. FIG. 1 shows the setup in which the test pads 22 are provided on the element-formed side and the layer connection pads 21 on the back of the chip at the opposite side. It should be noted, however, that the element-formed side may be constituted by the chip surface on the side of the layer connection pads 21. That is, the test pads 22 could be formed on the back side opposite the element-formed side. In this case, the test pads 22 at the back are connected electrically to the circuits on the element-formed side illustratively by through-silicon via (so-called TSV). The layout of the layer connection pads 21 held by the semiconductor memory device 2 is not limited to what is shown in FIG. 1. The layer connection pads 21 may be arranged in a bilaterally symmetrical manner as shown in FIG. 1. Alternatively, the pads 21 may be arranged in bilaterally as well as vertically symmetrical fashion. More specifically, the layer connection pads 21 may be located only in a region approximately in the middle of the chip, i.e., at equal distances from the four corners of the chip. As another alternative, the layer connection pads 21 may be positioned in a region including boundaries that split the chip into four portions lengthwise and crosswise by passing through the approximate chip center. As a further alternative, the layer connection pads 21 may be positioned in any number of split regions other than the quartered portions.

Likewise, the layout of the test pads 22 is not limited to what is shown in FIG. 1. Alternatively, the test pads 22 may be arranged in two or more rows. As another alternative, the test pads 22 may be located not only on the periphery of the chip but also in regions under the chip surface.

If the pad size and pitch of the test pads 22 are larger than those of the layer connection pads 21, the number of furnished test pads 22 and their positions are often subject to constraints especially where the pads 22 are provided on the same side as the element-formed side. However, since the test pads 22 may also be furnished on the back side opposite the element-formed side, the constraints above may not apply.

Meanwhile, even if the test pads 22 are approximately as small as the layer connection pads 21 in size, the number of test pads 22 is often limited because of the need to lower test costs by having a large number of chips tested concurrently using a limited number of input/output terminals of the tester in use. In this manner, the size and the number of test pads 22 as well as their locations are determined by a variety of factors. The test pads 22 may be formed suitably by taking these factors into consideration.

In FIG. 1, the test pads 22 are shown larger in size than the layer connection pads 21. Alternatively, the two kinds of pads may be made equal in size. As another alternative, the test pads 22 may be formed smaller in size than the layer connection pads 21.

In FIG. 1, the test probes are shown to be sharp-pointed metal pins. Alternatively, the test probes may each be formed having a plurality of bumps and hollows at the tip and capable of reciprocating inside an external cylinder actuated by recoiling force. As test probes are getting finer in shape, the test pads 22 may come to be equal to or even smaller than the layer connection pads 21 in size. In such cases, the present invention may still be implemented advantageously.

In the above-described fourth embodiment, the selection circuit 51_4 was shown to have the selecting function on both the input and the output sides. Alternatively, the selecting function may be limited to the data input side only.

The first through the fourth embodiments of the invention as well as their variations discussed above offer the following major advantages: first, the layer connection pads 21 and test pads 22 are furnished in such a manner that a larger number of layer connection pads 21 are mounted than before. Selection circuits are provided to assign data to pairs of layer connection pads 21 upon data input and output as well as to switch reciprocally the destinations for data input and/or output given an additional address. This arrangement permits a high frequency (e.g., data rate) for data input and output in a multilayered chip setup, and allows a plurality of chips to be tested simultaneously using a reduced number of pads at test time. Because the layer connection pads 21 are located inside the chip periphery, the pad layout is not conducive to enlarging the chip area.

The present invention, when embodied as described above, provides a data rate equivalent to that of the DDR scheme at half the data frequency in effect while offering as many addresses as those defined by DDR.

In addition, the functions provided by the present invention are equivalent to those of the DDR scheme. In implementing the invention, it is thus possible to appropriate the algorithms defined by DDR for chip control circuits. Because memories are layered in the implementation of the invention, the input/output paths between the memories are shortened, so that current dissipation can be reduced significantly.

With the frequency for data input and output lowered according to the invention, it is possible to send and receive data without using the data strobe signal (DQS) which is needed by DDR SDRAMs. It is also possible to guarantee a data rate equivalent to that of the DDR scheme without using falling edges of the clock. In this case, the setup of the invention guarantees the suitable timing without using the reverse phase clock signal (/CLK) needed by DDR SDRAMs. It is further possible to use the falling edges of the clock, which makes it possible to double the data rate in use, i.e., to implement a data rate twice that of the DDR scheme.

The present application contains subject matter related to that disclosed in Japanese Priority Patent Application JP 2009-217410 filed in the Japan Patent Office on Sep. 18, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A semiconductor memory device comprising:
   a semiconductor substrate;
   a plurality of pads formed on said semiconductor substrate and configured to permit data input and output; and
   a memory core block and an input/output block integrated on said semiconductor substrate;
   wherein, for every two data lines of said memory core block and for every two of said pads to and from which two data items are input and output, said input/output block is configured to switch reciprocally combinations of the interconnected data lines and pads based on an input address signal in such a manner as to determine to which of the two pads the two data items correspond, one of said two data lines being determined to be accessed for the memory address thereof based on information about said combinations, whereby the data items are input and output to and from said plurality of pads at twice a maximum access rate in effect.

2. The semiconductor memory device according to claim 1, wherein, for every two data lines of said memory core block and for every two of said pads, said input/output block has a selection circuit configured to assign the two output data items read from said memory core block to said two pads in accordance with one given address and to switch the pads to which the data items are output in keeping with another given address, said selection circuit being further configured to assign the two input data items coming from said two pads to said two data lines in accordance with one given address and to switch the data lines to which the data items are output in keeping with another given address.

3. The semiconductor memory device according to claim 2, wherein said plurality of pads are used commonly for input and output; and
   in a burst operation in which two cell data are input or output simultaneously to or from said memory core block upon input of one address designating a cell in said memory core block, said selection circuit switches reciprocally between a destination to or from which a first data item corresponding to said one address is input or output and a destination to or from which a second data item corresponding to another address is input or output.

4. The semiconductor memory device according to claim 3, wherein said selection circuit has two internal ports connected individually to each of two input/output data lines used commonly for data input and output.

5. The semiconductor memory device according to claim 3, wherein said selection circuit has a total of four internal ports, one pair of said internal ports being connected to input data lines, the other pair of said internal ports being connected to output data lines.

6. The semiconductor memory device according to claim 2, wherein said plurality of pads are separated functionally to deal with two purposes constituted by data input and data output; and
   in a burst operation in which two cell data are input or output simultaneously to or from said memory core block upon input of one address designating a cell in said memory core block, said selection circuit switches reciprocally, for each of the two purposes of data input and output, between one of a pair of pads to or from which a first data item corresponding to said one address is input or output and the other of said pair of pads to or from which a second data item corresponding to another address is input or output.

7. The semiconductor memory device according to claim 6, wherein said selection circuit has two internal ports connected individually to two input/output data lines each used commonly for data input and output.

8. The semiconductor memory device according to claim 6, wherein said selection circuit has a total of four internal ports, one pair of said internal ports being connected to input data lines, the other pair of said internal ports being connected to output data lines.

9. The semiconductor memory device according to claim 1, further comprising a plurality of pads for test purposes disposed on an element-formed side of said semiconductor substrate.

10. The semiconductor memory device according to claim 9, further comprising:
    a data compression circuit configured to output test results to an integrated circuit of said semiconductor substrate;
    wherein said plurality of pads for test purposes are in size equal to or larger than, and fewer in numbers than, the pads for data input and output purposes.

11. A multilayered chip semiconductor device comprising:
    a first semiconductor substrate including a control block; and
    a second semiconductor substrate including a memory block;
    said first and said second semiconductor substrates being interconnected electrically to form a layered substrate structure;
    wherein said second semiconductor substrate includes
        a plurality of pads for data input and output; and
        a memory core block and an input/output block integrated with one another;
    for every two data lines of said memory core block and for every two of said pads to and from which two data items are input and output, said input/output block is configured to switch reciprocally combinations of the interconnected data lines and pads based on an input address signal in such a manner as to determine to which of the two pads the two data items correspond, one of said two data lines being determined to be accessed for the memory address thereof based on information about said combinations, whereby the data items are input and output to and from said plurality of pads at twice a maximum access rate in effect.

12. The multilayered chip semiconductor device according to claim 11, wherein, for every two data lines of said memory core block and for every two of said pads, said input/output block has a selection circuit configured to assign the two output data items read from said memory core block to said two pads in accordance with one given address and to switch the pads to which the data items are output in keeping with another given address, said selection circuit being further configured to assign the two input data items coming from said two pads to said two data lines in accordance with one given address and to switch the data lines to which the data items are output in keeping with another given address.

* * * * *